United States Patent
Chen et al.

(10) Patent No.: US 10,033,011 B1
(45) Date of Patent: Jul. 24, 2018

(54) ENCAPSULATING MATERIAL, ENCAPSULATING COVER PLATE, SINTERING EQUIPMENT, SINTERING METHOD, AND DISPLAY APPARATUS

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Jingjing Chen, Beijing (CN); Liang Zhang, Beijing (CN); Fuyi Cui, Beijing (CN); Lina Wang, Beijing (CN); Xuewei Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/565,901

(22) PCT Filed: Apr. 13, 2017

(86) PCT No.: PCT/CN2017/080394
§ 371 (c)(1),
(2) Date: Oct. 11, 2017

(87) PCT Pub. No.: WO2017/193761
PCT Pub. Date: Nov. 16, 2017

(30) Foreign Application Priority Data

May 13, 2016 (CN) .......................... 2016 1 0320276

(51) Int. Cl.
*H01L 51/52* (2006.01)
*H01L 27/32* (2006.01)
(Continued)

(52) U.S. Cl.
CPC .......... *H01L 51/5246* (2013.01); *C03B 19/06* (2013.01); *C03C 27/06* (2013.01); *H01L 27/3244* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2014/0163664 A1* | 6/2014 | Goldsmith | A61B 17/00491 623/1.11 |
| 2015/0243926 A1* | 8/2015 | Deng | H01L 51/5246 257/40 |
| 2016/0002526 A1* | 1/2016 | Sato | C09K 11/02 257/98 |

FOREIGN PATENT DOCUMENTS

| CN | 1588633 A | 3/2005 |
|---|---|---|
| CN | 101113073 A | 1/2008 |

(Continued)

OTHER PUBLICATIONS

English translation of Chinese Office Action dated Jun. 20, 2017, for corresponding Chinese Application No. 201610320276.7.
(Continued)

*Primary Examiner* — Michelle Mandala
(74) *Attorney, Agent, or Firm* — Kinney & Lange, P.A.

(57) ABSTRACT

Embodiments of this disclosure provide an encapsulating material, an encapsulating cover plate, a sintering equipment, a sintering method, and a display apparatus, and relate to the technical field of display. This encapsulating material comprises a leveling auxiliary material, wherein the leveling auxiliary material is used to move upon excitation so as to level the encapsulating material when the encapsulating material is subjected to sintering, and is thus used in the encapsulation of a cover plate to be encapsulated and an encapsulating cover plate.

9 Claims, 4 Drawing Sheets

(51) Int. Cl.
      *C03B 19/06*    (2006.01)
      *C03C 27/06*    (2006.01)
      *H01L 51/56*    (2006.01)

(56) References Cited

FOREIGN PATENT DOCUMENTS

| | | |
|---|---|---|
| CN | 103715371 A | 4/2014 |
| CN | 103842312 A | 6/2014 |
| CN | 103922596 A | 7/2014 |
| CN | 104288501 A | 1/2015 |
| CN | 104617128 A | 5/2015 |
| CN | 105026493 A | 11/2015 |
| CN | 105957977 A | 9/2016 |
| JP | 2014534145 A | 12/2014 |

OTHER PUBLICATIONS

International Search Report and Written Opinion dated Jul. 12, 2017, for corresponding PCT Application No. PCT/CN2017/080394.
Second Chinese Office Action, for Chinese Patent Application No. 201610320276.7, dated Jan. 23, 2018, 6 pages.

\* cited by examiner

ENCAPSULATING MATERIAL, ENCAPSULATING COVER PLATE, SINTERING EQUIPMENT, SINTERING METHOD, AND DISPLAY APPARATUS

CROSS-REFERENCE TO RELATED APPLICATION

This application claims priority benefits of Chinese Application No. 201610320276.7 filed on May 13, 2016, the entire contents of which are hereby incorporated by reference.

TECHNICAL FIELD

This disclosure relates to the technical field of display, and particularly to an encapsulating material, an encapsulating cover plate, a sintering equipment, a sintering method, and a display apparatus.

BACKGROUND

In the existing display apparatuses, in order to avoid the influence of water and air on display devices, display apparatuses are usually encapsulated by using encapsulation techniques. An OLED (Organic Light-Emitting Diode) display apparatus is exemplified, and an OLED comprises: a cover plate to be encapsulated, an organic electroluminescence structure located on the cover plate to be encapsulated, and an encapsulating cover plate. Here, the cover plate to be encapsulated and the encapsulating cover plate are encapsulated using an encapsulating material, for example an epoxy resin or a glass cement. Since the glass cement has a far higher barrier property for water and oxygen than that of the epoxy resin, the glass cement is usually used to encapsulate OLEDs at present.

At present, the approach of glass cement encapsulation comprises placing an encapsulating cover plate coated with a glass cement into a heating apparatus and sintering to allow the glass cement to be in a melted state, decreasing the temperature of the heating apparatus after the glass cement is melted, withdrawing the encapsulating cover plate coated with the glass cement, cell-aligning the encapsulating cover plate and the cover plate to be encapsulated, and sealing with laser. Here, in the process of the sintering of the glass cement, organics in the glass cement will firstly combust as the temperature increases, and internal holes will be generated in the glass cement when the organics combust. When there are many holes inside the glass cement, the glass cement with holes will be easily eroded by external water vapor, so that encapsulation fails. At the meanwhile, the large number of holes inside the glass cement will influence mechanical properties of the display apparatus.

SUMMARY

Embodiments of this disclosure provide an encapsulating material, an encapsulating cover plate, a sintering equipment, a sintering method, and a display apparatus.

Embodiments of this disclosure provide technical solutions as follows.

In a first aspect, there is provided an encapsulating material comprising a leveling auxiliary material, wherein when the encapsulating material is subjected to sintering, the leveling auxiliary material moves upon excitation so as to level the encapsulating material.

Optionally, the leveling auxiliary material is a magnetic material.

Optionally, the Curie temperature of the magnetic material is greater than the melting temperature of the encapsulating material.

Optionally, the magnetic material is iron, cobalt, or nickel.

Optionally, the magnetic material is iron.

Optionally, the magnetic material is iron coated with ferric oxide.

Optionally, the content of the leveling auxiliary material is 5-10 wt %, based on the total weight of the encapsulating material.

In a second aspect, there is provided an encapsulating cover plate, the encapsulating area is coated with the encapsulating material described above.

In a third aspect, there is provided sintering equipment for sintering the encapsulating cover plate described above, comprising an exciting apparatus, a heating apparatus, and a base, wherein: the base is provided with a conveying area; the heating apparatus is used for heating the encapsulating cover plate; the base is used for supporting the encapsulating cover plate, and the encapsulating area of the encapsulating cover plate corresponds to the conveying area; and the exciting apparatus is used for exciting the movement of the leveling auxiliary material in the encapsulating material through the conveying area.

Optionally, the exciting apparatus is an electromagnetic wave emitting apparatus.

Optionally, the shape and size of the conveying area are consistent with the shape and size of the encapsulating area.

Optionally, the conveying area is an enclosed groove.

In a fourth aspect, there is provided a sintering method, comprising the steps of: placing the encapsulating cover plate described above on the base of the sintering equipment described above, and allowing the encapsulating area to correspond to the conveying area on the base; controlling the temperature of the heating apparatus so that the encapsulating material is in a melted state; and starting the exciting apparatus to excite the movement of the leveling auxiliary material in the encapsulating material through the conveying area on the base.

Optionally, the leveling auxiliary material is a magnetic material; the exciting apparatus is an electromagnetic wave emitting apparatus; and the step of starting the exciting apparatus to excite the movement of the leveling auxiliary material in the encapsulating material through the conveying area on the base comprises: starting the electromagnetic wave emitting apparatus so that an electromagnetic wave emitted from the electromagnetic wave emitting apparatus excites the movement of the magnetic material through the conveying area on the base.

Optionally, the conveying area is an enclosed groove; and the step of starting the electromagnetic wave emitting apparatus so that an electromagnetic wave emitted from the electromagnetic wave emitting apparatus excites the movement of the magnetic material through the conveying area on the base comprises: starting the electromagnetic wave emitting apparatus so that the electromagnetic wave emitted from the electromagnetic wave emitting apparatus excites the movement of the magnetic material through the enclosed groove on the base.

In a fifth aspect, there is provided a display apparatus, comprising a cover plate to be encapsulated and an encapsulating cover plate sintered by the sintering method described above.

Optionally, an organic electroluminescence structure is provided on the cover plate to be encapsulated.

BRIEF DESCRIPTION OF THE DRAWINGS

In order to illustrate the technical solutions in embodiments of this disclosure or in the prior art more clearly, figures required for describing the embodiments or the prior art will be simply introduced below. It is apparent that the figures described below are merely some embodiments of this disclosure, and other figures may be further obtained by ordinary skilled person in the art according to these figures without exerting inventive work.

DETAILED DESCRIPTION

Figure 1:
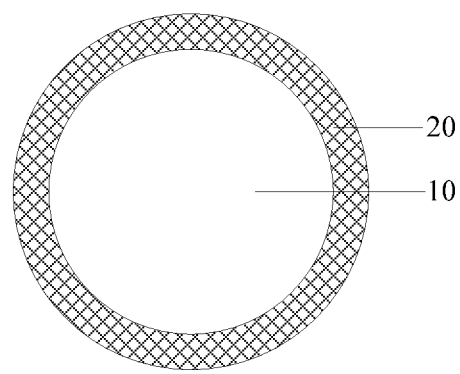
FIG. 1 is a structural schematic diagram of iron coated with ferric oxide provided in an embodiment of this disclosure.

The technical solutions in embodiments of this disclosure will be clearly and fully described below in conjunction with accompanying drawings in embodiments of this disclosure. Obviously, the embodiments described are merely a part of the embodiments of this disclosure, rather than all of the embodiments. Based on the embodiments of this disclosure, all other embodiments obtained by those of ordinary skill in the art without performing inventive work belong to the scope protected by this disclosure.

An embodiment of this disclosure provides an encapsulating material comprising a leveling auxiliary material, wherein when the encapsulating material is subjected to sintering, the leveling auxiliary material is used to move upon excitation so as to level the encapsulating material.

Firstly, it is to be indicated that an encapsulating material comprising a leveling auxiliary material means that an encapsulating material in embodiments of this disclosure further comprises a leveling auxiliary material, with respect to a typical encapsulating material.

Here, a glass cement in the prior art is exemplified and typically comprises an adhesive, a solvent, etc., and as the encapsulating material provided by this disclosure, only a leveling auxiliary material is required to be added to an existing glass cement.

In view of good barrier property of the glass cement for water and oxygen, it is thus preferable that the encapsulating material may be a glass cement with a leveling auxiliary material added in embodiments of this disclosure.

Secondly, the leveling auxiliary material in the encapsulating material is not limited, as long as it can move upon excitation. It may be, for example, a magnetic leveling auxiliary material. That is, the leveling auxiliary material in the encapsulating material may move when it is excited by an electromagnetic wave. Of course, it may also be a photo-leveling auxiliary material, an electro-leveling auxiliary material, etc.

The particular content of the leveling auxiliary material in the encapsulating material is not particularly limited, as long as the leveling auxiliary material can move upon excitation. However, in order to achieve a better auxiliary leveling effect, the content of the leveling auxiliary material is 5-10 wt %, more preferably 5-8 wt %, and most preferably 5-6 wt %, based on the total weight of the encapsulating material.

According to a preferred embodiment of this disclosure, the encapsulating material comprises a glass cement and a leveling auxiliary material, wherein the content of the leveling auxiliary material is 5-10 wt %, based on the total weight of the encapsulating material.

An embodiment of this disclosure provides an encapsulating material. Since the encapsulating material comprises the leveling auxiliary material, when the encapsulating material is subjected to sintering to allow the encapsulating material to be in a melted state, the leveling auxiliary material in the encapsulating material will move if the encapsulating material is excited. In this way, the leveling will be accelerated after the encapsulating material in a flowing state is subjected to the action of the movement of the leveling auxiliary material. In particular, as for burrs on the surface of the encapsulating material and internal holes, burrs on the surface of the encapsulating material will be leveled and internal holes will be filled in the flowing process of the encapsulating material. When this encapsulating material is coated onto an encapsulating cover plate to laser-seal the encapsulating cover plate and the cover plate to be encapsulated, the laser sealing proportion of the encapsulating material may be improved, so that the encapsulation effect of the encapsulating material is better.

Since the magnetic material will not be easily influenced by the encapsulating material upon excitation, for example a photo-leveling auxiliary material needs to ensure that the encapsulating material is transparent and an electro-leveling auxiliary material needs to ensure that the encapsulating material is conductive, it is preferable that the leveling auxiliary material is a magnetic material in embodiments of this disclosure.

Here, as to be indicated, since the temperature is relatively high when the encapsulating material is subjected to sintering, it needs to be ensured that the Curie temperature (magnetic transition temperature) of the magnetic material in the encapsulating material is greater than the melting temperature of the encapsulating material in order to avoid the loss of the magnetic property of the magnetic material at a high temperature.

Here, the magnetic material may be, for example, iron (Fe), cobalt (Co), nickel (Ni), etc.

The shape of the magnetic material is not particularly limited, as long as it can achieve the effect according to this application. However, it is preferable that the magnetic material has the shape of spherical particles with a diameter of 4.5 to 6 μm.

Since iron is inexpensive and the Curie temperature of the element of iron is relatively high (the Curie temperature of iron element is relatively high and is 770° C.), the sintering temperature of the encapsulating material, for example glass cement, is lower than the Curie temperature of iron. That is, the element of iron may remain to be magnetic in the sintering process of the encapsulating material, and therefore it is preferable that the magnetic material is iron in embodiments of this disclosure.

According to an embodiment of this disclosure, in order to avoid the loss of the magnetic property due to oxidation reaction of iron occurring at a high temperature, it is thus further preferable that the magnetic material iron 10 in the encapsulating material is coated with ferric oxide 20, as shown in FIG. 1.

According to an embodiment of this disclosure, by the protection for iron 10 with ferric oxide 20, the loss of the magnetic property due to oxidation reaction of iron 10 occurring at a high temperature may be prevented and the encapsulation of the encapsulating material will not be influenced.

Figure 2:
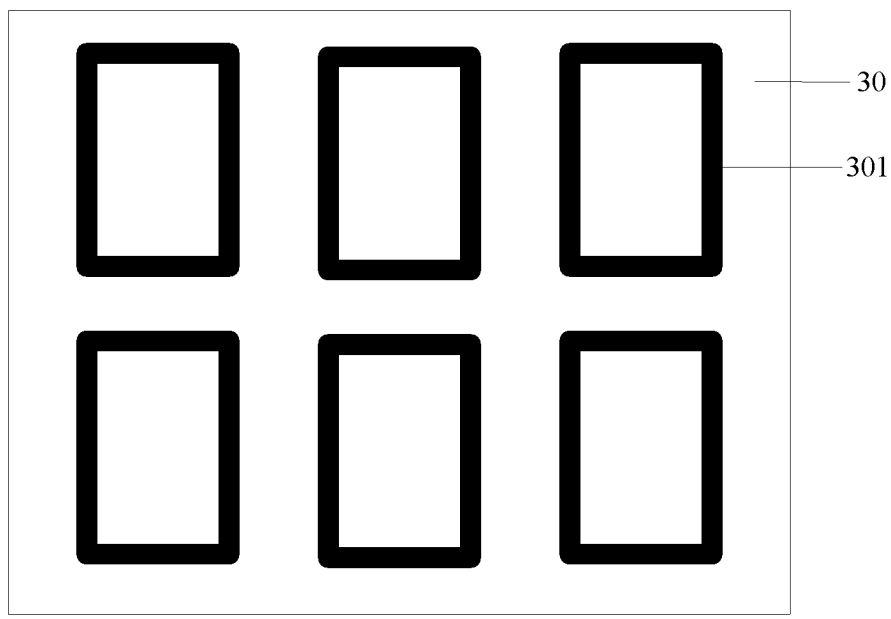
FIG. 2 is a structural schematic diagram of an encapsulating cover plate provided in an embodiment of this disclosure.

An embodiment according to this disclosure provides an encapsulating cover plate 30, as shown in FIG. 2, comprising an encapsulating area 301 coated with the encapsulating material described above.

Here, the shape and size of the encapsulating area 301 of the encapsulating cover plate 30 may be rationally set according to the encapsulation requirements of the encapsulating cover plate 30 and the cover plate to be encapsulated.

An embodiment of this disclosure provides an encapsulating cover plate 30. Since the encapsulating material coated on the encapsulating area 301 of this encapsulating cover plate 30 comprises the leveling auxiliary material, when the encapsulating material is subjected to sintering to allow the encapsulating material to be in a melted state, the leveling auxiliary material in the encapsulating material will move if the encapsulating material of the encapsulating area 301 is excited. In this way, the leveling will be accelerated after the encapsulating material in a flowing state is subjected to the action of the movement of the leveling auxiliary material. In particular, as for burrs on the surface of the encapsulating material and internal holes, burrs on the surface of the encapsulating material will be leveled and internal holes will be filled in the flowing process of the encapsulating material. Therefore, when the encapsulating cover plate 30 coated with the encapsulating material and a cover plate to be encapsulated are laser-sealed, the laser sealing proportion of the encapsulating material is improved, so that the encapsulation effect of the encapsulating material is better.

An embodiment of this disclosure provides a sintering equipment for sintering the encapsulating cover plate 30 described above, as shown in FIGS. 3(a) and (b), comprising an exciting apparatus 40, a heating apparatus, and a base 50. The base 50 is provided with a conveying area 501.

Here, the heating apparatus is used for heating the encapsulating cover plate 30; the base 50 is used for supporting the encapsulating cover plate 30, and the encapsulating area 301 of the encapsulating cover plate 30 corresponds to the conveying area 501; and the exciting apparatus 40 is used for exciting the movement of the leveling auxiliary material in the encapsulating material through the conveying area 501.

Firstly, it is to be indicated that with respect to the heating apparatus, the criterion is that the encapsulating material coated on the encapsulating cover plate 30 can be sintered and the temperature may be adjusted.

Here, when the encapsulating cover plate 30 is heated by the heating apparatus, in the process of temperature increase of the encapsulating material, since the ignition points of organics are relatively low, the organics in the encapsulating material will firstly combust and the encapsulating material will be in a melted state as the temperature continues to increase.

Secondly, as for the exciting apparatus 40, it should be set according to the leveling auxiliary material in the encapsulating material. For example, when the leveling auxiliary material in the encapsulating material is a magnetic material, the exciting apparatus 50 may be an electromagnetic wave emitting apparatus which can emit an electromagnetic wave; and when the leveling auxiliary material in the encapsulating material is a photo-leveling auxiliary material, the exciting apparatus may be a light-emitting apparatus.

Figure 3A:
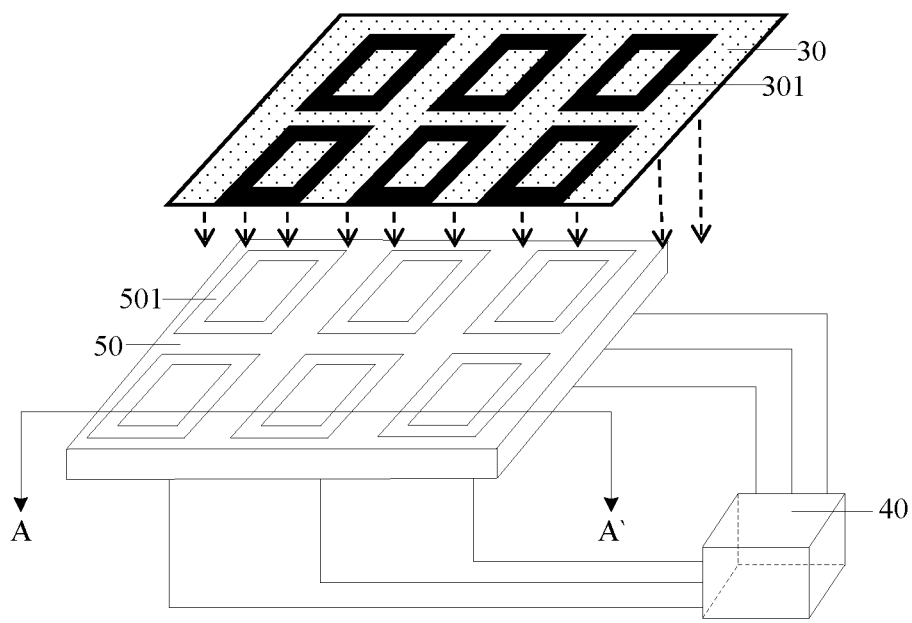
FIG. 3(a) is a structural schematic diagram of a sintering equipment provided in an embodiment of this disclosure.
Figure 3B:
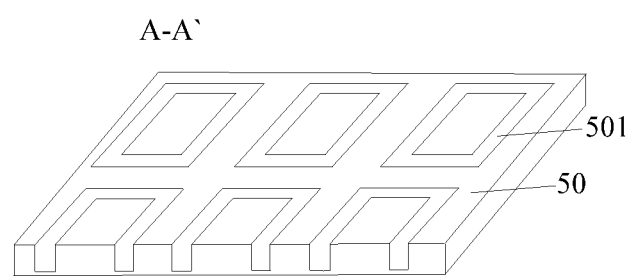
FIG. 3(b) is a sectional schematic diagram in the direction of A-A' in FIG. 3(a).

Thirdly, as for the conveying area 501, it may be provided on the whole base 50, or as shown in FIG. 3(a) or 3(b), it may be merely provided in an area on the base 50 corresponding to the encapsulating area 301. Furthermore, the conveying area 501 may be separately provided on the base 50, or may be embedded inside the base 50.

It is to be indicated that the conveying area 501 is used to provide a passage for the exciting apparatus 40 so as to excite the movement of the leveling auxiliary material in the encapsulating material, and therefore the conveying area 501 should ensure that the electromagnetic wave emitted from the exciting apparatus 40, for example an electromagnetic wave emitting apparatus, can be transmitted and maintained in the conveying area 501. Since the encapsulating area 20 of the encapsulating material corresponds to the conveying area 501, when an electromagnetic wave exists in the conveying area 501, the magnetic material in the encapsulating material will move under the action of the electromagnetic wave.

Furthermore, the manner in which the electromagnetic wave emitted from the exciting apparatus 40, for example an electromagnetic wave emitting apparatus, is transmitted to the conveying area 501 is not limited.

An embodiment of this disclosure provides a sintering equipment for sintering the encapsulating cover plate 30 described above. The heating apparatus in this sintering equipment may provide a temperature environment allowing for the melting of the encapsulating material. The encapsulating cover plate 30 coated with the encapsulating material is placed on the base 50, and the encapsulating area 301 of the encapsulating cover plate 30 is allowed to correspond to the conveying area of the base 50. When the exciting apparatus 40 is started, the conveying area 301 may excite the movement of the leveling auxiliary material in the encapsulating material. In this way, the leveling will be accelerated after the encapsulating material in a flowing state is subjected to the action of the movement of the leveling auxiliary material. In particular, as for burrs on the surface of the encapsulating material and internal holes, burrs on the surface of the encapsulating material will be leveled and internal holes will be filled in the flowing process of the encapsulating material. Therefore, when the encapsulating cover plate 30 coated with the encapsulating material and a cover plate to be encapsulated are laser-sealed, the laser sealing proportion of the encapsulating material is improved, so that the encapsulation effect of the encapsulating material is better.

Preferably, the encapsulating material of the encapsulating cover plate 30 comprises a magnetic material, the exciting apparatus 40 is an electromagnetic wave emitting apparatus, and the electromagnetic wave emitted from the electromagnetic wave emitting apparatus may allow for the movement of the magnetic material in the encapsulating material.

Here, with respect to the frequency of the electromagnetic wave emitted from the electromagnetic wave emitting apparatus, the criterion is that it allows for the movement of the magnetic material.

Preferably, the shape and size of the conveying area 501 are consistent with those of the encapsulating area 301.

An embodiment of this disclosure provides a sintering equipment, wherein the shape and size of the conveying area 501 are consistent with those of the encapsulating area 301. On the one hand, if the conveying area 501 is excessively small, it may result in that a part of the leveling auxiliary material in the encapsulating material of the encapsulating cover plate 30 placed on the base 50 is not excited and does not move, and therefore as a result, burrs and holes remain in the encapsulating material of the encapsulating cover plate 30. On the other hand, if the conveying area 501 is excessively large and for example the exciting apparatus 40 is an electromagnetic wave emitting apparatus, the substance for transmitting the electromagnetic wave provided in the conveying area 501 will be more or the material of the conveying area 501 for transmitting the electromagnetic wave will increased, thereby resulting in waste.

Preferably, as shown in FIGS. 3(*a*) and 3(*b*), the conveying area 501 is an enclosed groove.

According to an embodiment of this disclosure, an enclosed groove is directly formed on the base 50 instead of separately providing a conveying area 501 on the base 50, so that the manufacture process of the sintering equipment may be simplified.

Figure 4:
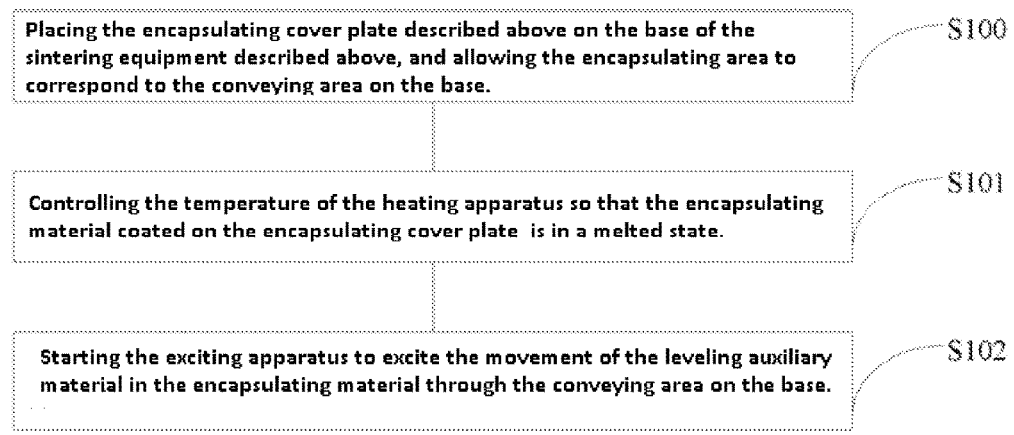
FIG. 4 is a schematic flow chart of a sintering method provided in an embodiment of this disclosure.

An embodiment of this disclosure provides a sintering method, as shown in FIG. 4, comprising the steps of:

S100, placing the encapsulating cover plate 30 described above on the base 50 of the sintering equipment described above, and allowing the encapsulating area 301 to correspond to the conveying area 501 on the base 50.

Figure 5A:
FIG. 5(a) is a structural schematic diagram of the morphology of an encapsulating material coated onto an encapsulating cover plate provided in an embodiment of this disclosure.
Figure 5B:
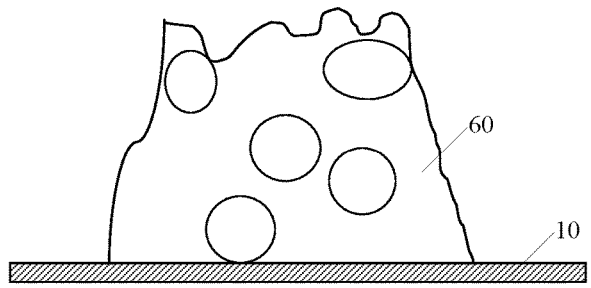
FIG. 5(b) is a structural schematic diagram of the morphology in the process of combustion of an encapsulating material provided in an embodiment of this disclosure.
Figure 5C:
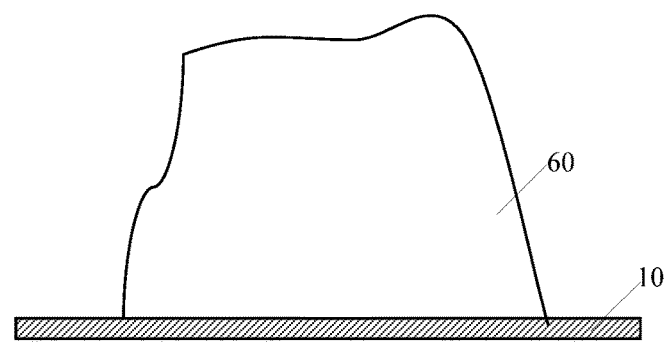
FIG. 5(c) is a structural schematic diagram of the morphology of an encapsulating material after being sintered in sintering equipment provided in an embodiment of this disclosure.

When the encapsulating material 60 comprising a leveling auxiliary material, for example a magnetic material, is coated onto the encapsulating cover plate 30 by a process of screen printing, there are burrs on the surface of the encapsulating material 60, as shown in FIG. 5(*a*).

S101, controlling the temperature of the heating apparatus so that the encapsulating material coated on the encapsulating cover plate 30 is in a melted state.

Here, the temperature of the heating apparatus may be controlled according to the melting point of the encapsulating material 60 coated on the encapsulating cover plate 30.

The temperature of the heating apparatus is controlled to sinter the encapsulating material 60. In the process of temperature increase, since melting points of organics are relatively low, organics will first combust. The morphology of the encapsulating material 60 at this point is as shown in FIG. 5(*b*), and holes occur in the interior of the encapsulating material 60. The encapsulating material 60 will be in a melted state as the temperature continues to increase.

S102, starting the exciting apparatus 40 to excite the movement of the leveling auxiliary material in the encapsulating material through the conveying area 501 on the base 50.

The exciting apparatus 50, for example an electromagnetic wave emitting apparatus, is started. Since the electromagnetic wave emitted from the electromagnetic wave emitting apparatus may generate an effect of attraction or repulsion on the leveling auxiliary material, for example a magnetic material, the magnetic material begins to move under the excitation action of the electromagnetic wave. At this point, the leveling may be accelerated after the encapsulating material 60 in a flowing state is subjected to the action of the movement of the magnetic material. In particular, as for burrs on the surface of the encapsulating material and internal holes, as shown in FIG. 5(*c*), burrs on the surface of the encapsulating material will be leveled and internal holes will be filled in the flowing process of the encapsulating material 60.

After the melting of the encapsulating material 60, the exciting apparatus 40 is shut down. The temperature of the heating apparatus is decreased, and the encapsulating cover plate 30 is withdrawn to perform the encapsulation of the encapsulating cover plate 30 and the cover plate to be encapsulated.

An embodiment of this disclosure provides a sintering method. The heating apparatus in this sintering equipment may provide a temperature environment allowing for the melting of the encapsulating material. The encapsulating cover plate 30 coated with the encapsulating material is placed on the base 50, and the encapsulating area 301 of the encapsulating cover plate 30 is allowed to correspond to the conveying area 501 of the base 50. When the exciting apparatus 40 is started, the conveying area 301 may excite the movement of the leveling auxiliary material in the encapsulating material 60. In this way, the leveling will be accelerated after the encapsulating material 60 in a flowing state is subjected to the action of the movement of the leveling auxiliary material. In particular, as for burrs on the surface of the encapsulating material 60 and internal holes, burrs on the surface of the encapsulating material 60 will be leveled and internal holes will be filled in the flowing process of the encapsulating material. Therefore, when the encapsulating cover plate 30 coated with the encapsulating material 60 and a cover plate to be encapsulated are laser-sealed, the laser sealing proportion of the encapsulating material is improved, so that the encapsulation effect of the encapsulating material is better.

Preferably, the leveling auxiliary material is a magnetic material; the exciting apparatus 40 is an electromagnetic wave emitting apparatus. The step of starting the exciting apparatus 40 to excite the movement of the leveling auxiliary material in the encapsulating material through the conveying area 501 on the base 50 comprises: starting the electromagnetic wave emitting apparatus so that the electromagnetic wave emitted from the electromagnetic wave emitting apparatus excites the movement of the magnetic material through the conveying area 501 on the base 50.

Since the magnetic material will not be easily influenced by the material of the encapsulating material 60 upon excitation, for example a photo-leveling auxiliary material needs to ensure that the encapsulating material 60 is transparent and an electro-leveling auxiliary material needs to ensure that the encapsulating material 60 is conductive, it is preferable that the leveling auxiliary material is a magnetic material in embodiments of this disclosure. When the encapsulating material 60 of the encapsulating cover plate 30 comprises a magnetic material, the exciting apparatus 40 is an electromagnetic wave emitting apparatus and the electromagnetic wave emitted from the electromagnetic wave emitting apparatus may excite the movement of the magnetic material in the encapsulating material 60 through the conveying area 501 on the base 50.

Further preferably, the conveying area 501 is an enclosed groove; the step of starting the electromagnetic wave emitting apparatus so that the electromagnetic wave emitted from the electromagnetic wave emitting apparatus excites the movement of the magnetic material through the conveying area 501 on the base 50, comprises: starting the electromagnetic wave emitting apparatus so that the electromagnetic wave emitted from the electromagnetic wave emitting apparatus excites the movement of the magnetic material through the enclosed groove on the base 50.

According to an embodiment of this disclosure, an enclosed groove is directly formed on the base 50 instead of separately providing a conveying area 501 on the base 50, so that the manufacture process of the sintering equipment may be simplified.

An embodiment of this disclosure provides a display apparatus, comprising a cover plate to be encapsulated and an encapsulating cover plate 10 sintered by the sintering equipment described above.

In an embodiment of this disclosure, since the burrs on the surface of the encapsulating material 70 of the encapsulating cover plate 10 sintered by the sintering equipment described above will be leveled and internal holes will be filled in the flowing process of the encapsulating material, the encapsulation effect is better when the encapsulating cover plate 10 and the cover plate to be encapsulated are laser-sealed, so that the display apparatus formed has good mechanical properties.

Figure 6:
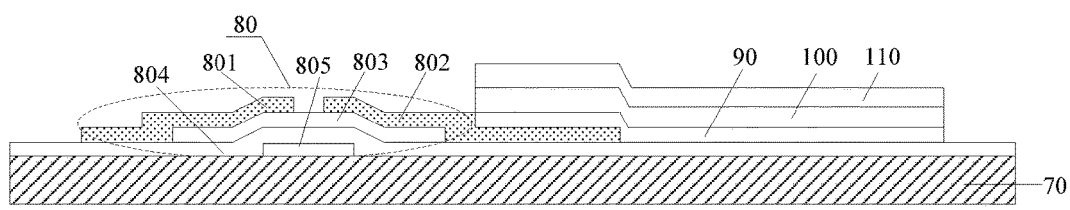
FIG. 6 is a structural schematic diagram of a cover plate to be encapsulated provided in an embodiment of this disclosure.

Preferably, as shown in FIG. 6, an organic electroluminescence structure is provided on the cover plate to be encapsulated 70.

Here, the organic electroluminescence structure comprises a thin film transistor 80, an anode 90, an organic electroluminescence layer 100, and a cathode 110. The thin film transistor 80 comprises a source electrode 801, a drain electrode 802, an active layer 803, a gate insulating layer 804, and a gate electrode 805. The drain electrode 802 of the thin film transistor 80 is in electrical connection with the anode 90.

When the light emitted from the organic electroluminescence layer 100 is white light, the cover plate to be encapsulated 70 may further comprise a color filter structure. Those may be specifically set according to practical conditions, and verbose words are omitted herein.

Embodiments of this disclosure provide an encapsulating material, an encapsulating cover plate, a sintering equipment, a sintering method, and a display apparatus. Since the encapsulating material comprises the leveling auxiliary material, when the encapsulating material is subjected to sintering to allow the encapsulating material to be in a melted state, the leveling auxiliary material in the encapsulating material will move if the encapsulating material is excited. In this way, the leveling will be accelerated after the encapsulating material in a flowing state is subjected to the action of the movement of the leveling auxiliary material. In particular, as for burrs on the surface of the encapsulating material and internal holes, burrs on the surface of the encapsulating material will be leveled and internal holes will be filled in the flowing process of the encapsulating material. When this encapsulating material is coated onto an encapsulating cover plate to laser-seal the encapsulating cover plate and the cover plate to be encapsulated, the laser sealing proportion of the encapsulating material may be improved, so that the encapsulation effect of the encapsulating material is better.

That is, embodiments of this disclosure provide an encapsulating material, an encapsulating cover plate, a sintering equipment, a sintering method, and a display apparatus. It is possible to ameliorate burrs on the surface of the encapsulating material and reduce holes inside the encapsulating material so as to improve the laser sealing proportion of the encapsulating material and ameliorate the encapsulation effect of the encapsulating material.

The above embodiments are only specific embodiments of the disclosure, but the scope of the disclosure is not limited thereto. Within the technical scope disclosed by this disclosure, any person skilled in the art will easily conceive variations or replacements, which should be covered by the scope of the disclosure. Therefore, the protection scope of the disclosure should be determined by the protection scope of the claims.

What is claimed is:

1. A sintering equipment for sintering an encapsulating cover plate comprising an encapsulating area coated with an encapsulating material, wherein the encapsulating material comprises a leveling auxiliary material, wherein when the encapsulating material is subjected to sintering, the leveling auxiliary material moves upon excitation so as to level the encapsulating material, and the sintering equipment comprises an exciting apparatus, a heating apparatus, and a base, wherein:
   the base is provided with a conveying area;
   the heating apparatus is configured for heating the encapsulating cover plate;
   the base is configured for supporting the encapsulating cover plate, and the encapsulating area of the encapsulating cover plate corresponds to the conveying area; and
   the exciting apparatus is configured for exciting the movement of the leveling auxiliary material in the encapsulating material through the conveying area.

2. The sintering equipment according to claim 1, wherein the exciting apparatus is an electromagnetic wave emitting apparatus.

3. The sintering equipment according to claim 1, wherein a shape and size of the conveying area are consistent with a shape and size of the encapsulating area.

4. The sintering equipment according to claim 1, wherein the conveying area is an enclosed groove.

5. A sintering method, comprising the steps of:
   placing an encapsulating cover plate comprising an encapsulating area coated with an encapsulating material on a base of a sintering equipment that includes an exciting apparatus, a heating apparatus, and the base, and allowing the encapsulating area to correspond to a conveying area on the base, wherein the encapsulating material comprises a leveling auxiliary material, wherein when the encapsulating material is subjected to sintering, the leveling auxiliary material moves upon excitation so as to level the encapsulating material;
   controlling a temperature of the heating apparatus so that the encapsulating material coated on the encapsulating cover plate is in a melted state; and
   starting the exciting apparatus to excite movement of the leveling auxiliary material in the encapsulating material through the conveying area on the base,
   wherein:
   the base is provided with the conveying area;
   the heating apparatus is configured for heating the encapsulating cover plate;
   the base is configured for supporting the encapsulating cover plate, and the encapsulating area of the encapsulating cover plate corresponds to the conveying area; and
   the exciting apparatus is configured for exciting the movement of the leveling auxiliary material in the encapsulating material through the conveying area.

6. The sintering method according to claim 5, wherein the leveling auxiliary material is a magnetic material;

the exciting apparatus is an electromagnetic wave emitting apparatus; and the step of starting the exciting apparatus to excite the movement of the leveling auxiliary material in the encapsulating material through the conveying area on the base comprises: starting the electromagnetic wave emitting apparatus so that an electromagnetic wave emitted from the electromagnetic wave emitting apparatus excites the movement of the magnetic material through the conveying area on the base.

7. The sintering method according to claim 6, wherein the conveying area is an enclosed groove; and the step of starting the electromagnetic wave emitting apparatus so that an electromagnetic wave emitted from the electromagnetic wave emitting apparatus excites the movement of the magnetic material through the conveying area on the base comprises: starting the electromagnetic wave emitting apparatus so that the electromagnetic wave emitted from the electromagnetic wave emitting apparatus excites the movement of the magnetic material through the enclosed groove on the base.

8. A display apparatus, comprising a cover plate to be encapsulated and an encapsulating cover plate sintered by the sintering method of claim 5.

9. The display apparatus according to claim 8, wherein an organic electroluminescence structure is provided on the cover plate to be encapsulated.

\* \* \* \* \*